United States Patent

Wang et al.

[11] Patent Number: 5,117,199
[45] Date of Patent: May 26, 1992

[54] FULLY DIFFERENTIAL FOLLOWER USING OPERATIONAL AMPLIFIER

[75] Inventors: Chorng K. Wang, San Jose; Roomy Khan, Santa Clara; David A. Freitas, San Jose, all of Calif.

[73] Assignee: International Business Machines Corporation, Armonk, N.Y.

[21] Appl. No.: 676,904

[22] Filed: Mar. 27, 1991

[51] Int. Cl.[5] .............................................. H03F 3/45
[52] U.S. Cl. ...................................... 330/252; 330/85; 330/258
[58] Field of Search .................. 330/69, 85, 253, 258, 330/260, 302, 306, 311, 252, 300; 360/67, 68, 69

[56] References Cited

U.S. PATENT DOCUMENTS

| | | | |
|---|---|---|---|
| 3,919,654 | 11/1975 | Toumani | 330/85 X |
| 4,293,820 | 10/1981 | Dinh | 330/85 |
| 4,435,734 | 3/1984 | Hedberg et al. | 332/113 X |
| 4,568,885 | 2/1986 | McKenzie et al. | 330/253 |
| 4,573,020 | 2/1986 | Whatley | 330/258 |
| 4,667,165 | 5/1987 | DeWeck | 330/253 |
| 4,749,956 | 6/1988 | Torelli et al. | 330/253 |
| 4,794,349 | 12/1988 | Senderowicz et al. | 330/253 |

*Primary Examiner*—Steven Mottola
*Attorney, Agent, or Firm*—David J. Kappos

[57] ABSTRACT

A fully differential operational amplifier having unity gain is provided. The amplifier includes a differential input stage having two pairs of differential inputs. One pair receives the input signal. The other pair is connected internally to receive differential mode feedback from the output stage. The two pairs of differential inputs are combined with a common mode feedback signal and cascoded to the output. The amplifier incorporates automatic internal noise cancellation due to its differential mode feedback, and may be constructed in MOS logic, or in BiCMOS for high frequency operation. Applications include buffering for filters in circuitry requiring high speed and noise cancellation, such as data channels and servo channels in data recording devices.

13 Claims, 5 Drawing Sheets

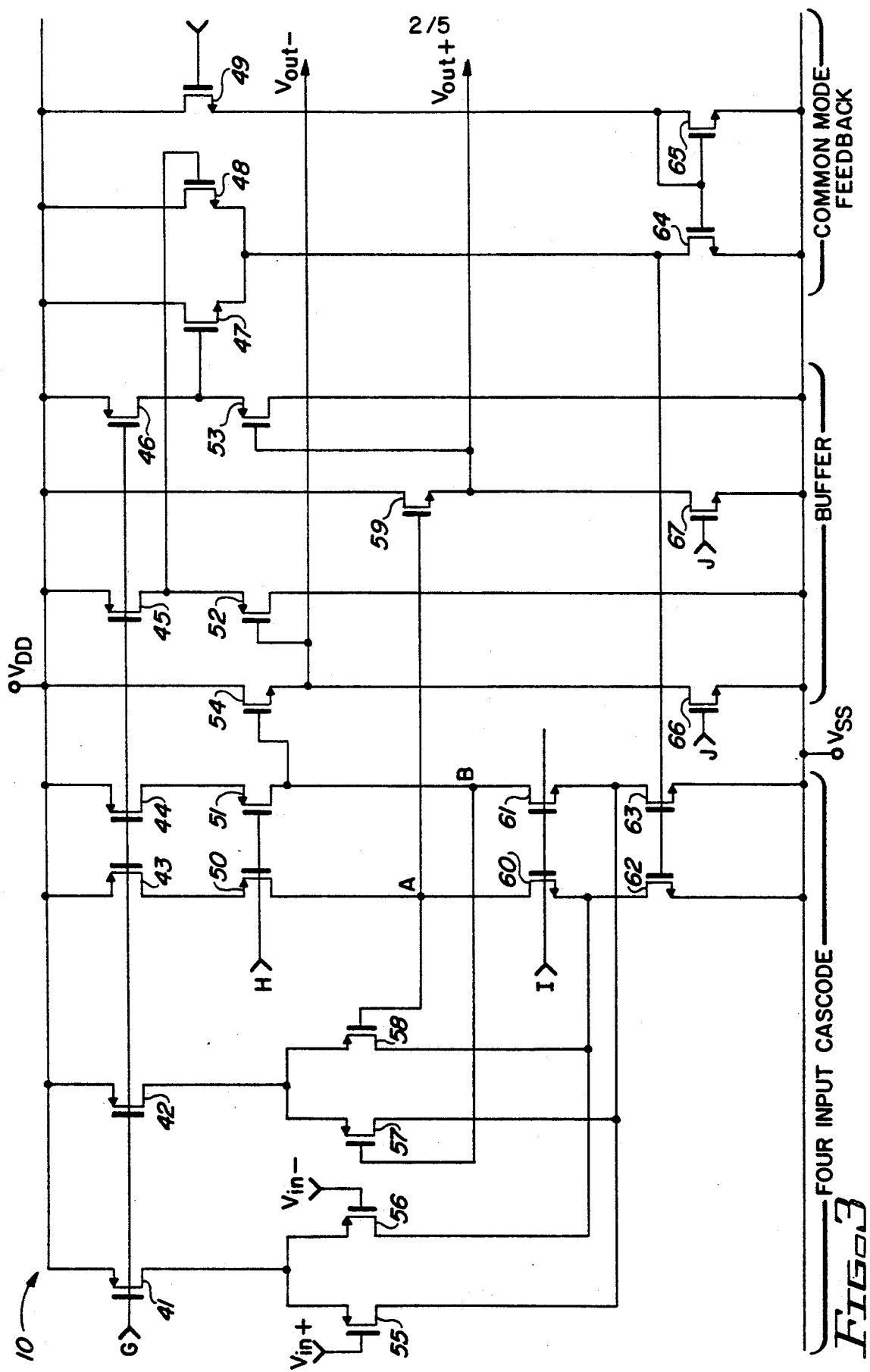
*FIG. 3* — FOUR INPUT CASCODE

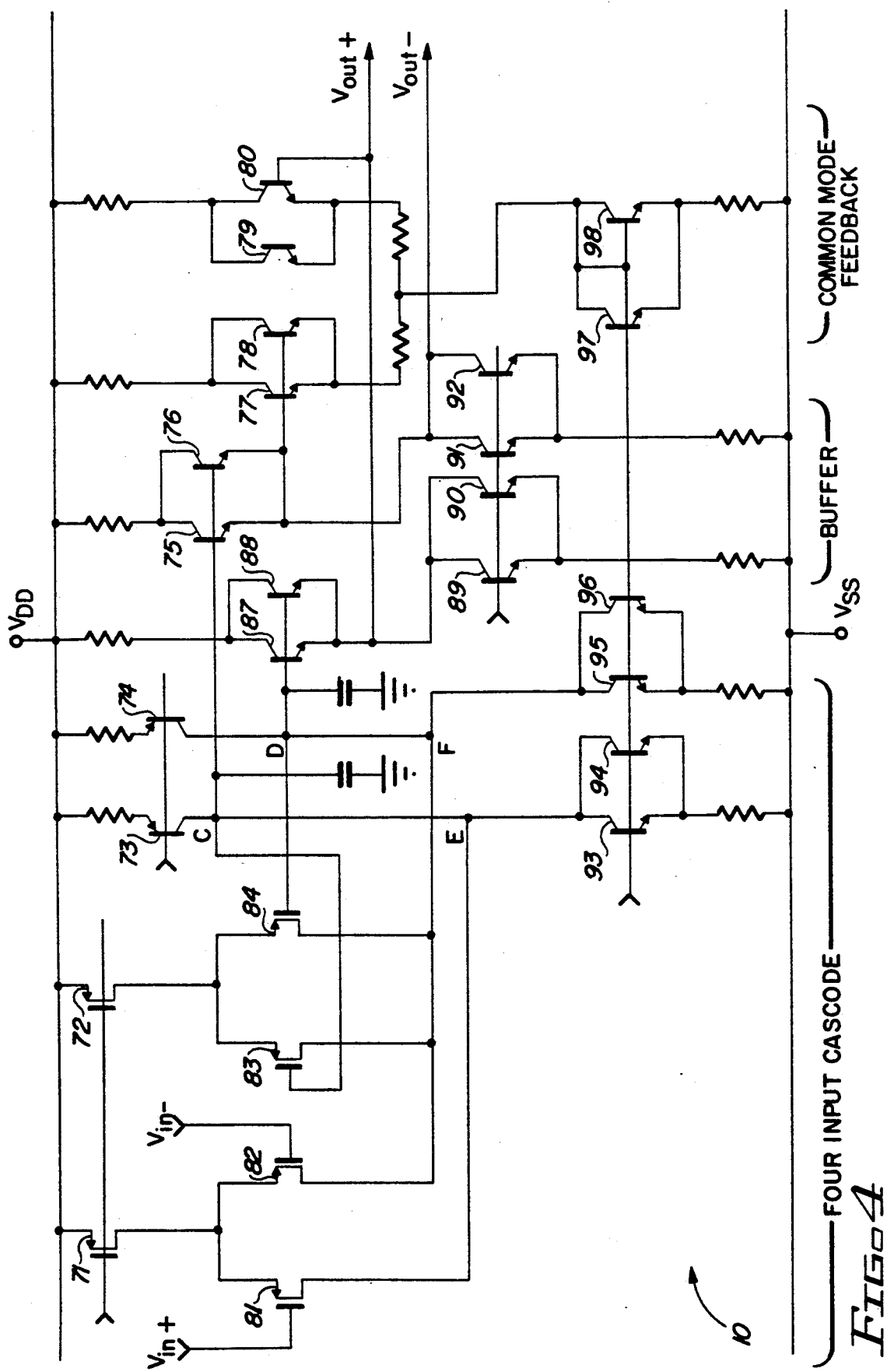
FIG. 4 — FOUR INPUT CASCODE

DATA CHANNEL ARCHITECTURE EMPLOYING FULLY DIFFERENTIAL FOLLOWER

SERVO CHANNEL ARCHITECTURE EMPLOYING FULLY DIFFERENTIAL FOLLOWER

FULLY DIFFERENTIAL FOLLOWER USING OPERATIONAL AMPLIFIER

This invention relates in general to operational amplifiers, and in particular to operational amplifiers having differential inputs and differential outputs.

BACKGROUND OF THE INVENTION

Included in the general class of amplifiers are fully differential operational amplifiers having differential inputs and differential outputs. Fully differential operational amplifiers have the advantageous properties of good power supply rejection and good dynamic range.

However, fully differential operational amplifiers as shown in the prior art have a significant drawback, in that they cannot be configured as unity gain circuits (that is, as fully differential unity gain operational amplifiers). Moreover, configurations of prior art dual single-ended operational amplifiers aimed at achieving unity gain typically incur a major penalty in the form of poor noise rejection and hence poor dynamic range as compared with fully differential architecture, where common mode noise cancels itself. Finally, configurations of prior art single-ended operational amplifiers aimed at achieving fully differential operation and unity gain suffer further disadvantages by requiring a large chip area and a great deal of power due to the necessary duplication of components.

Another possible alternative to fully differential architecture is passive components, but here too the prior art suffers drawbacks. There is the inability to integrate some passive components (e.g. coils), which necessitates external componentry and hence low frequency operation. Also, there are limitations on the types and performance of even those filters that can be implemented in integrated passive components.

OBJECTS OF THE INVENTION

It is therefore an object of the present invention to provide a fully differential operational amplifier having unity gain.

It is another object of the present invention to provide a fully differential, unity gain operational amplifier that uses differential mode feedback.

It is another object of the present invention to provide a fully differential, unity gain operational amplifier having built-in noise cancellation.

It is another object of the present invention to provide a fully differential, unity gain operational amplifier capable of high frequency operation.

It is another object of the present invention to provide a fully differential, unity gain operational amplifier suitable for use in a data channel and servo channel of a data recording device.

These and other objects will become more apparent when read in light of the following specification and drawings.

SUMMARY OF THE INVENTION

In accordance with the invention, a fully differential operational amplifier having unity gain is provided. The amplifier includes a differential input stage having two pairs of differential inputs, a cascode stage, a differential mode feedback stage, a common mode feedback stage, and a buffered output stage. One pair of differential inputs receives the input signal from an external analog source. The other pair internally receives differential mode feedback from the output stage. The outputs of the two pairs of differential inputs combine with a common mode feedback signal to drive the cascode stage, which in turn feeds the output stage.

The differential mode feedback provides automatic internal noise cancellation, the fully integrated design enables the amplifier to achieve high frequency operation, and the use of only one operational amplifier results in small chip area and power requirements. A metal oxide semiconductor (MOS) design is disclosed, as well as a bipolar complimentary metal oxide semiconductor (BiCMOS) design for use where higher frequency operation is desirable. The latter design uses MOS inputs for high impedance, bipolar cascode transistors for high speed, bipolar current sources for high output impedance, bipolar emitter-followers for driving capability, and bipolar common mode feedback for fast common mode speed.

The fully differential unity gain operational amplifier (also known as a fully differential follower) of the present invention has particular applicability to data channels and servo channels in data recording devices, where high speed operation and noise cancellation are important. In one application, the circuit is used to create a Sallen and Key filter which provides low pass filtering and buffering between noisy components. The filter is readily integrated on the same chip as other functions, and the resulting VLSI device is placed in the data channel or servo channel circuitry of the data recording device.

BRIEF DESCRIPTION OF THE DRAWINGS

FIG. 3 is a circuit diagram illustrating a fully differential follower according to the preferred embodiment of the present invention.

FIG. 4 is a circuit diagram illustrating a fully differential follower according to an alternative construction of the preferred embodiment of the present invention.

DESCRIPTION OF THE PREFERRED EMBODIMENT

Figure 1:
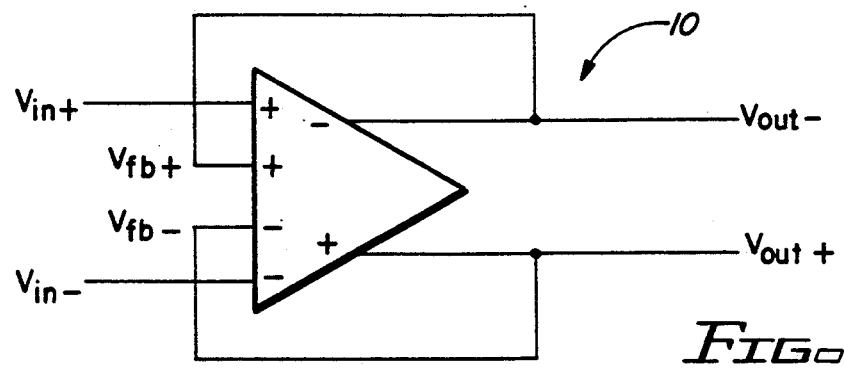
FIG. 1 is a schematic diagram illustrating a fully differential follower according to the present invention.

Shown in FIG. 1 is a fully differential unity gain operational amplifier 10, also known as a fully differential follower, illustrating the present invention. Fully differential follower 10 generally comprises two pairs of differential inputs and one pair of differential outputs having voltage polarities as indicated. Differential mode feedback is provided from $V_{out-}$ to $V_{fb+}$ and from $V_{out+}$ to $V_{fb-}$, respectively, to create unity gain across the amplifier. It is to be noted that, as indicated conceptually in FIG. 1, fully differential follower 10 is realized based on one operational amplifier. This provides the present invention with an important advantage over the prior art, since it means the present invention requires less area and less power than the dual single-ended followers used to construct fully differential operational amplifiers according to the prior art.

Figure 2:
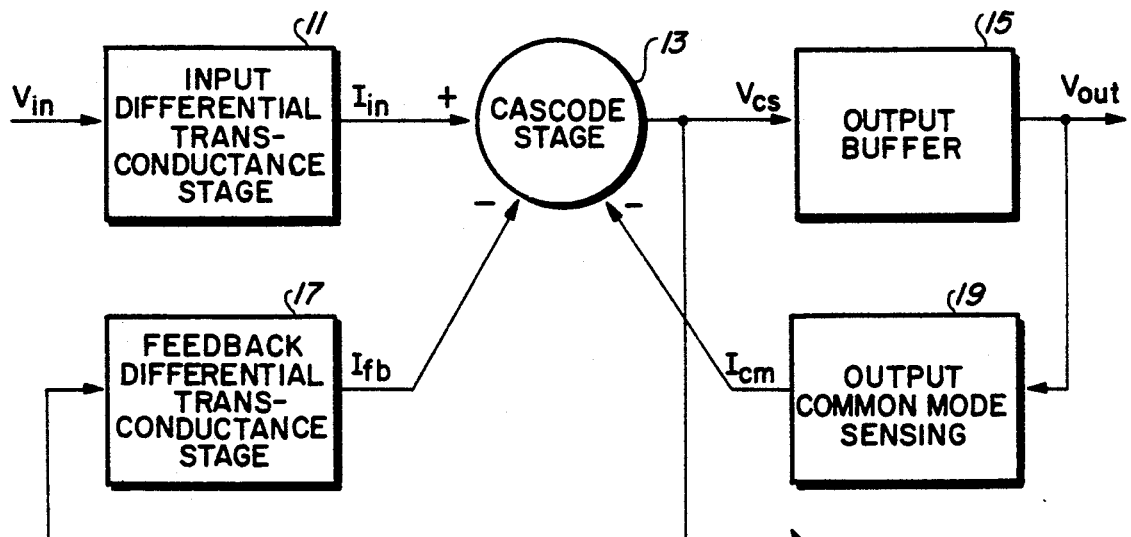
FIG. 2 is a block diagram illustrating a fully differential follower according to the present invention.

Shown in FIG. 2 is a block diagram of the internal structure of fully differential follower 10 illustrating the principle of the present invention. Input differential transconductance stage 11 transforms input differential voltage $V_{in}$ into input differential current $I_{in}$. Cascode stage 13 has three current inputs $I_{in}$ from input differential transconductance stage 11, $I_{fb}$ from feedback differential transconductance stage 17, and $I_{cm}$ from output common mode sensing stage 19. In operation, cascode stage 13 provides a high impedance output differential voltage $V_{cs}$ representative of the sum of its three inputs. Output buffer 15 has an input connected to $V_{cs}$, the output from cascode stage 13, and an output $V_{out}$, which forms the output differential voltage for fully differential follower 10. In operation, output buffer 15 provides low impedance buffering at output $V_{out}$ of fully differential follower 10.

Feedback differential transconductance stage 17, which forms an important part of the present invention, has an input connected to $V_{cs}$, the output of cascode stage 13, and an output $I_{fb}$ which forms one of the inputs to cascode stage 13. In operation, feedback differential transconductance stage 17 provides fully differential follower 10 with unity gain by feeding back the differential mode component of $V_{cs}$ to cascode stage 13 in the form of current $I_{fb}$. Output common mode sensing stage 19 has an input connected to $V_{out}$, the output of output buffer 15, and an output $I_{cm}$ which forms one of the inputs to cascode stage 13. In operation, output common mode sensing stage 19 senses any common mode variation present at $V_{out}$ and feeds this back to cascode stage 13 in the form of current $I_{cm}$.

Shown in FIG. 3 is a circuit diagram of the preferred embodiment of fully differential follower 10. The design is in MOS technology which can be fully integrated on a single chip or as part of a larger chip including other functions. P-channel metal oxide semiconductor (PMOS) device 41 has a source connected to $V_{DD}$, gate driven at node G by a biasing circuit (as described below in conjunction with FIG. 5) and connected to the gates of devices 42, 43, 44, 45 and 46, and a drain connected to the sources of devices 55 and 56. PMOS device 42 has a source connected to $V_{DD}$, a gate connected as described above, and a drain connected to the sources of devices 57 and 58. PMOS device 43 has a source connected to $V_{DD}$, a gate connected as described above, and a drain connected to the source of device 50. PMOS device 44 has a source connected to $V_{DD}$, a gate connected as described above, and a drain connected to the source of device 51. PMOS device 45 has a source connected to $V_{DD}$, a gate connected as described above, and a drain connected to the source of device 52 and the gate of device 48. PMOS device 46 has a source connected to $V_{DD}$, a gate connected as described above, and a drain connected to the source of device 53 and the gate of device 47. N-channel metal oxide semiconductor (NMOS) device 47 has a drain connected to $V_{DD}$, a gate connected as described above, and a source connected to the source of device 48, the drain of device 64, and the gates of devices 62 and 63. NMOS device 48 has a drain connected to $V_{DD}$, and a gate and source connected as described above. NMOS device 49 has a drain connected to $V_{DD}$, a gate, and a source connected to the drain of device 65 and the gates of devices 64 and 65.

PMOS device 50 has a source connected as described above, a gate driven at node H by a biasing circuit (as described below in conjunction with FIG. 5) and connected to the gate of device 51, and a drain connected to the gates of devices 58 and 59, and the drain of device 60. PMOS device 51 has a source and a gate connected as described above, and a drain connected to the gates of devices 54 and 57, and the drain of device 61. PMOS device 52 has a source connected as described above, a gate connected to the source of device 54 and the drain of device 66, which also forms the $V_-$ output of fully differential follower 10, and a drain connected to $V_{SS}$. PMOS device 53 has a source connected as described above, a gate connected to the source of device 57 and the drain of device 67, which also forms the $V_+$ output of fully differential follower 10, and a drain connected to $V_{SS}$. NMOS device 54 has a drain connected to $V_{DD}$, and a gate and source connected as described above.

PMOS device 55 has a source connected as described above, a gate which forms the $V_+$ input of fully differential follower 10, and a drain connected to the drains of devices 57 and 63, and the source of device 61. PMOS device 56 has a source connected as described above, a gate which forms the $V_-$ input of fully differential follower 10, and a drain connected to the drains of devices 58 and 62, and the source of device 60. PMOS device 57 has a source, gate, and drain connected as described above. PMOS device 58 has a source, gate, and drain connected as described above. NMOS device 59 has a drain connected to $V_{DD}$, and a gate and source connected as described above.

NMOS device 60 has a drain and source connected as described above, and a gate driven at node I by a biasing circuit (as described below in conjunction with FIG. 5) and connected to the gate of device 61. NMOS device 61 has a drain, gate, and source connected as described above. NMOS device 62 has a drain connected as described above, a gate connected to the gate of device 63 and the drain of device 64 and a source connected to $V_{SS}$. NMOS device 63 has a drain and gate connected as described above, and a source connected to $V_{SS}$. NMOS device 64 has a drain and gate connected as described above, and a source connected to $V_{SS}$. NMOS device 65 has a drain and gate connected as described above, and a source connected to $V_{SS}$. NMOS device 66 has a drain connected as described above, a gate driven at node J by a biasing circuit (as described below in conjunction with FIG. 5), and a source connected to $V_{SS}$. NMOS device 67 has a drain connected as described above, a gate driven at node J by a biasing circuit (as described below in conjunction with FIG. 5), and a source connected to $V_{SS}$.

In operation, MOS devices 55, 56, 57 and 58 constitute the four differential inputs to fully differential follower 10. The inputs to transistor pair 57,58 are connected to the differential output at nodes A and B to form a negative feedback loop. This configuration forms an important part of the present invention, as it provides the differential mode feedback which enables fully differential follower 10 to achieve unity gain. The inputs to transistors 55 and 56 are cascoded through transistor pair 60,61 to the output. Transistor pairs 43,44 and 50,51 form current sources, which are cascoded to obtain high output impedance.

Source followers are used as buffers to improve driving capability. Transistors 54 and 59 form an NMOS follower, while transistors 45 and 53 form a PMOS follower. The two source followers, NMOS followed by PMOS, keep the common mode in the middle of the supply range.

Devices 47, 48 and 49 create common mode feedback which sets the proper output common mode voltage. The input to the gate of transistor 49 is referred back to the output as the common mode output level for fully differential follower 10.

Shown in FIG. 4 is a circuit diagram of the preferred embodiment of fully differential follower 10, designed using bipolar logic to achieve higher speed than that obtainable using all MOS logic. Like the design shown in FIG. 3, the circuit of FIG. 4 can be fully integrated on a single chip or as part of a larger chip including other functions. PMOS device 71 has a source connected to $V_{DD}$, a gate connected to the gate of device 72, and a drain connected to the sources of devices 81 and 82. PMOS device 72 has a source connected to $V_{DD}$, a gate connected as described above, and a drain connected to the sources of devices 83 and 84. Bipolar PNP device 73 has an emitter connected through a resistor to $V_{DD}$, a base connected to the base of device 74, and a collector connected to the gate of device 83, the collector of device 85, the base of device 75, and through a capacitor to ground. Bipolar PNP device 74 has an emitter connected through a resistor to $V_{DD}$, a base connected as described above, and a collector connected to the gate of device 84, the collector of device 86, the base of device 87, and through a capacitor to ground. Bipolar NPN device 75 has a collector connected to the collector of device 76 and through a resistor to $V_{DD}$, a base connected as described above, and an emitter connected to the emitter of device 76, the bases of devices 77 and 78, and the collectors of devices 91 and 92, which also forms the $V_-$ output of fully differential follower 10. Bipolar NPN device 76 has a collector, base, and emitter connected as described above. Bipolar NPN device 77 has a collector connected to the collector of device 78 and through a resistor to $V_{DD}$, a base connected as described above, and an emitter connected to the emitter of device 78, and through a resistor to the bases of devices 93, 94, 95, 96, 97 and 98, the collectors of devices 97 and 98, and through a second resistor to the emitters of devices 79 and 80. Bipolar NPN device 78 has a collector, base, and emitter connected as described above. Bipolar NPN device 79 has a collector connected to the collector of device 80 and through a resistor to $V_{DD}$, a base, and an emitter connected as described above. Bipolar NPN device 80 has a collector and an emitter connected as described above, and a base connected to the emitters of devices 87 and 88 and the collectors of devices 89 and 90, which also forms the $V_+$ output of fully differential follower 10.

PMOS device 81 has a source connected as described above, a gate which forms the $V_+$ input of fully differential follower 10, and a drain connected to the drain of device 83, the emitter of device 85, and the collectors of devices 93 and 94. PMOS device 82 has a source connected as described above, a gate which forms the $V_-$ input of fully differential follower 10, and a drain connected to the drain of device 84, the emitter of device 86, and the collectors of devices 95 and 96. PMOS device 83 has a source, gate, and drain connected as described above. PMOS device 84 has a source, gate, and drain connected as described above. Bipolar NPN device 85 has a collector and emitter connected as described above, and a base connected to the base of device 86. Bipolar NPN device 86 has a collector, base, and emitter connected as described above.

Bipolar NPN device 87 has a base and emitter connected as described above, and a collector connected to the collector of device 88 and through a resistor to $V_{DD}$. Bipolar NPN device 88 has a collector, base, and emitter connected as described above. Bipolar NPN device 89 has a collector connected as described above, a base connected to the emitter of devices 90, 91 and 92, and an emitter connected to the emitter of device 90 and through a resistor to $V_{SS}$. Bipolar NPN device 90 has a collector, base, and emitter connected as described above. Bipolar NPN device 91 has a collector and base connected as described above, and an emitter connected to the emitter of device 92 and through a resistor to $V_{SS}$. Bipolar NPN device 92 has a collector, base, and emitter connected as described above.

Bipolar NPN device 93 has a collector and base connected as described above, and an emitter connected to the emitter of device 94 and through a resistor to $V_{SS}$. Bipolar NPN device 94 has a collector, base, and emitter connected as described above. Bipolar NPN device 95 has a collector and base connected as described above, and an emitter connected to the emitter of device 96 and through a resistor to $V_{SS}$. Bipolar NPN device 96 has a collector, base, and emitter connected as described above. Bipolar NPN device 97 has a collector and base connected as described above, and an emitter connected to the emitter of device 98 and through a resistor to $V_{SS}$. Bipolar device 98 has a collector, base, and emitter connected as described above.

In operation, MOS pairs 81,82 and 83,84 constitute the four inputs to fully differential follower 10. MOS devices are used rather than bipolar devices to create high input impedance. Cascode transistors 85 and 86 are implemented in bipolar to achieve higher $G_m$ and low parasitic capacitance. The first non-dominant pole associated with capacitance at nodes E and F is thereby pushed out. The cascoded current sources are replaced by a single bipolar pair 73,74 because the high output impedance of PNP transistors provides sufficient gain at nodes C and D, and the single pair provides improved (smaller) output swing over the cascode arrangement. Additionally, it is to be noted that even higher gain and smaller output swing may be achieved with the circuit according to FIG. 4 by cascoding PNP devices.

NPN emitter followers 75,76 and 87,88 and 89,90 and 91,92 are used because NPN emitter followers have better driving capability than do MOS source followers. The devices are paralleled for current handling purposes. Common mode feedback is provided by differential pair 77,78 and 79,80 in conjunction with diode-connected pair 97,98. Bipolar feedback results in much faster common mode speed. Finally, no external reference is required since the bipolar transistors have a precise turn-on voltage $V_{BE}$.

Figure 5:
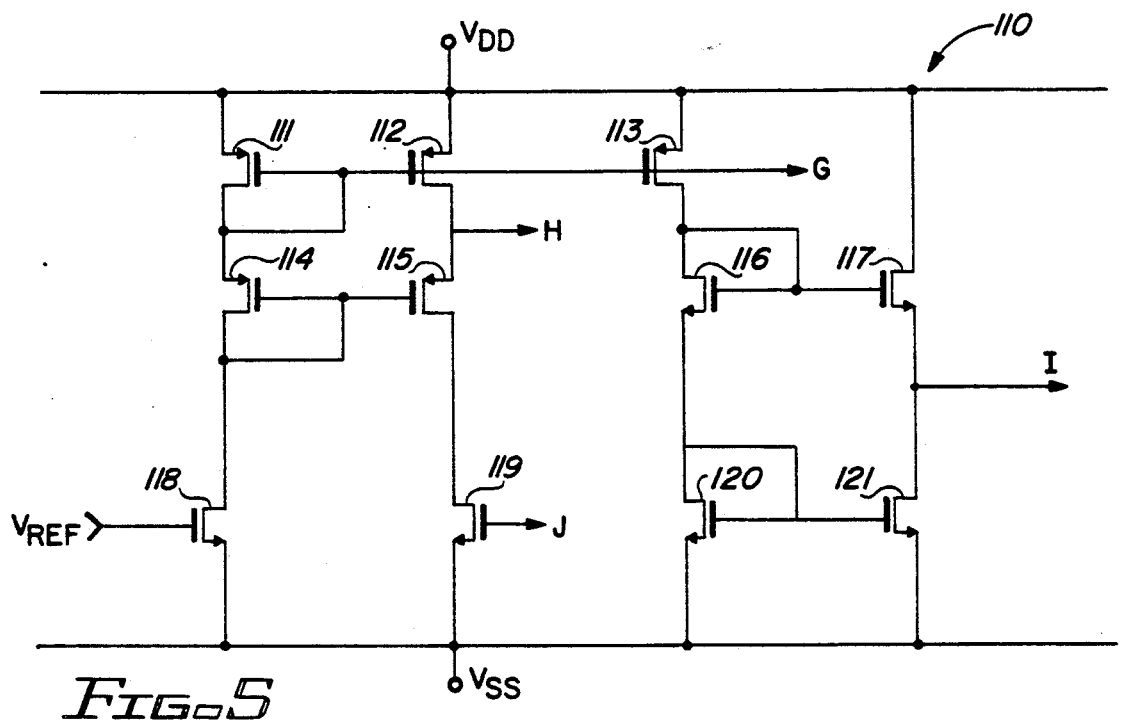
FIG. 5 is a circuit diagram illustrating a biasing circuit for use with the preferred embodiment of the present invention.

Shown in FIG. 5 is a circuit diagram of a biasing circuit constructed for use with the preferred embodiment of the present invention. PMOS device 111 has a source connected to $V_{DD}$, and a gate and drain connected to one another, to the gates of devices 112 and 113, to the source of device 114, and to node G, which provides drive current to devices in FIG. 3 as described above. PMOS device 112 has a source connected to $V_{DD}$, a gate connected as described above, and a drain connected to the source of device 115 and to node H, which provides drive current to devices in FIG. 3 as described above. PMOS device 113 has a source connected to $V_{DD}$, a gate connected as described above, and a drain connected to the drain of device 116 and the gates of devices 116 and 117. PMOS device 114 has a source connected as described above, and a gate and drain connected to one another, to the gate of device 115, and to the drain of device 118. PMOS device 115 has a source and gate connected as described above, and a drain connected to the drain and gate of device 119 and to node J, which provides drive current to devices in FIG. 3 as described above.

NMOS device 116 has a drain and gate connected as described above, and a source connected to the drain of device 120 and the gates of devices 120 and 121. NMOS device 117 has a drain connected to $V_{DD}$, a gate connected as described above, and a source connected to the drain of device 121 and to node I, which provides drive current to devices in FIG. 3 as described above. NMOS device 118 has a drain connected as described above, a gate connected to reference voltage $V_{REF}$, and a source connected to $V_{SS}$. NMOS device 119 has a drain and gate connected as described above, and a source connected to $V_{SS}$. NMOS device 120 has a drain and gate connected as described above, and a source connected to $V_{SS}$. NMOS device 121 has a drain and gate connected as described above, and a source connected to $V_{SS}$.

In operation, $V_{REF}$ is applied to the gate of transistor 118 and sets the current through transistors 111, 114 and 118. The current is mirrored through transistor 112, 113 and 115. The current through transistor 113 is in turn mirrored through transistors 116, 117, 120 and 121. All devices are MOS because of the near infinite input impedance provided thereby.

Figure 6:
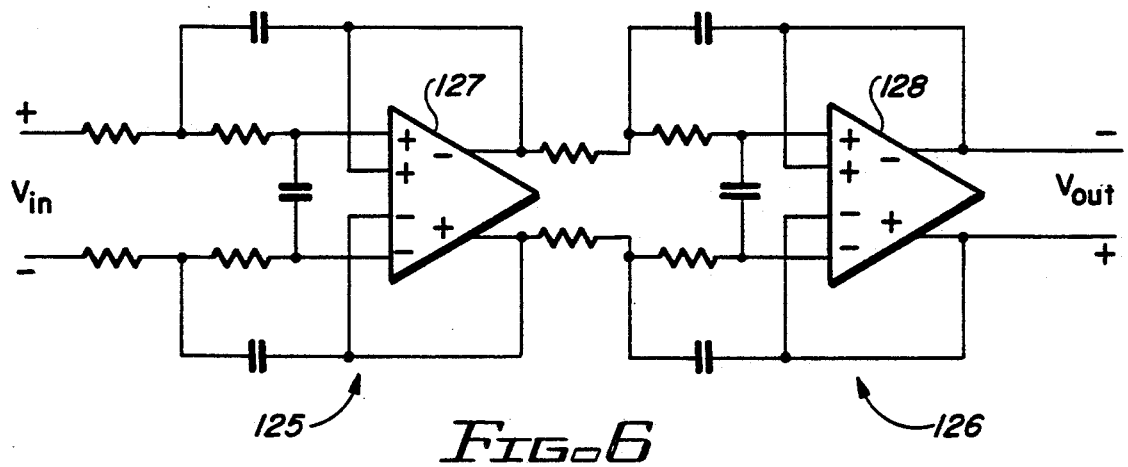
FIG. 6 is a schematic diagram illustrating a Sallen and Key filter, which forms an application for a fully differential follower according to the present invention.

Shown in FIG. 6 is a schematic diagram of a fourth order Sallen and Key low pass filter illustrating an application for the present invention. The filter includes cascoded biquad low pass filters 125 and 126, wherein each biquad is realized by a fully differential unity gain buffer (127 and 128) according to the present invention. The connections of the resistors and capacitors that couple to fully differential buffers 127 and 128 to form biquads 125 and 126, as well as the particular resistance and capacitance values necessary to create a filter having a given frequency response, are matters well known to those skilled in the art of electronic filters, and therefore will not be described in detail here. The important aspect of FIG. 6 is that it presents an application which makes advantageous use of the high speed and noise immunity associated with the present invention to form a filter which in turn displays improved speed, noise immunity, and area and power requirements over a comparable filter built according to the prior art.

Figure 7:
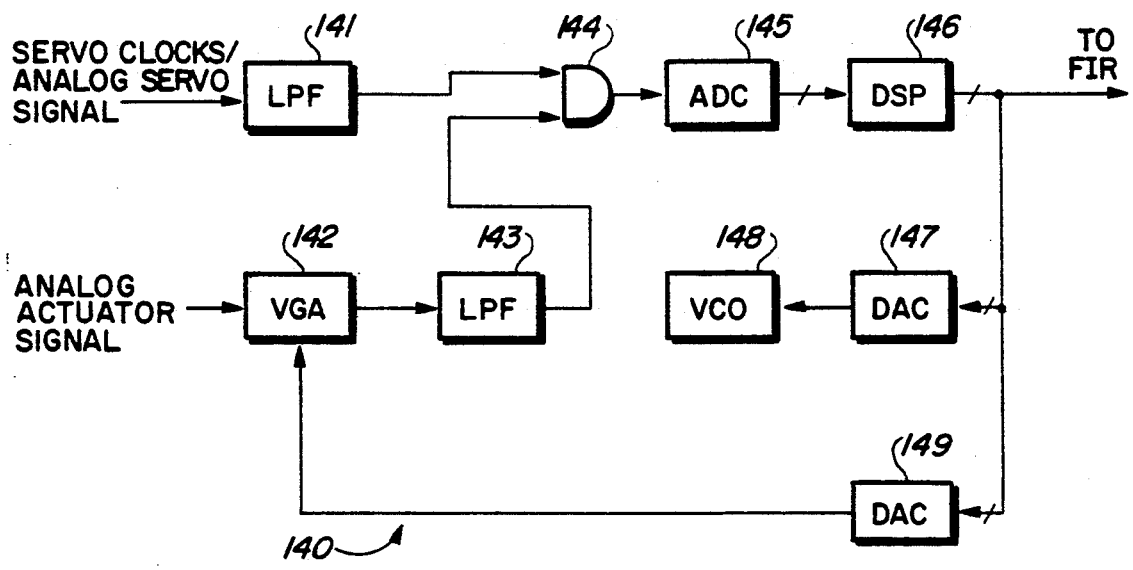
FIG. 7 is a block diagram illustrating a data channel of a data recording device, which forms an application for a fully differential follower according to the present invention.

Shown in FIG. 7 is a block diagram of a partial-response-maximum-likelihood (PRML) circuit 140, which forms part of the data channel electronics for a data recording device, illustrating another application for the present invention. PRML circuit 140 includes low pass filter 141, voltage gain amplifier 142, low pass filter 143, analog multiplexor 144, analog-to-digital converter 145, digital signal processor 146, digital-to-analog converter 147, voltage controlled oscillator 148, and digital-to-analog converter 149.

In operation, an analog servo signal or servo clocks received from an information storage disk is passed through low pass filter 141, which may be implemented according to the Sallen and Key design shown in FIG. 6 or according to numerous other designs known in the art. Low pass filter 141 includes one or more fully differential followers according to the present invention, thereby achieving the high frequency capability and noise rejection properties associated with the present invention.

An analog actuator signal, which consists of user data in the case of a dedicated servo disk file and user data or servo information in the case of a sector servo disk file, is received from a data access actuator associated with the information storage disk and is passed through voltage gain amplifier 142, where it is amplified to a level appropriate for subsequent processing. The amplified signal then passes through low pass filter 143 which, like low pass filter 141, includes at least one fully differential follower constructed according to the present invention. The filtered output from low pass filter 143 is then multiplexed with the filtered output from low pass filter 141 in multiplexor 144. The resultant output of summing node 144 is converted to its digital equivalent by analog-to-digital converter 145, and the digital information is post-filtered by digital signal processor 146, whereupon the filtered digital information is output to external circuitry comprising a finite impulse response filter.

Digital-to-analog converter 147 converts the digital information from digital signal processor 146 back into its analog equivalent and provides this signal to voltage controlled oscillator 148, which in turn provides a clocking signal to analog-to-digital converter 145. Digital-to-analog converter 149 converts the digital information from digital signal processor 146 back into its analog equivalent and provides this signal as feedback to voltage gain amplifier 142.

Figure 8:
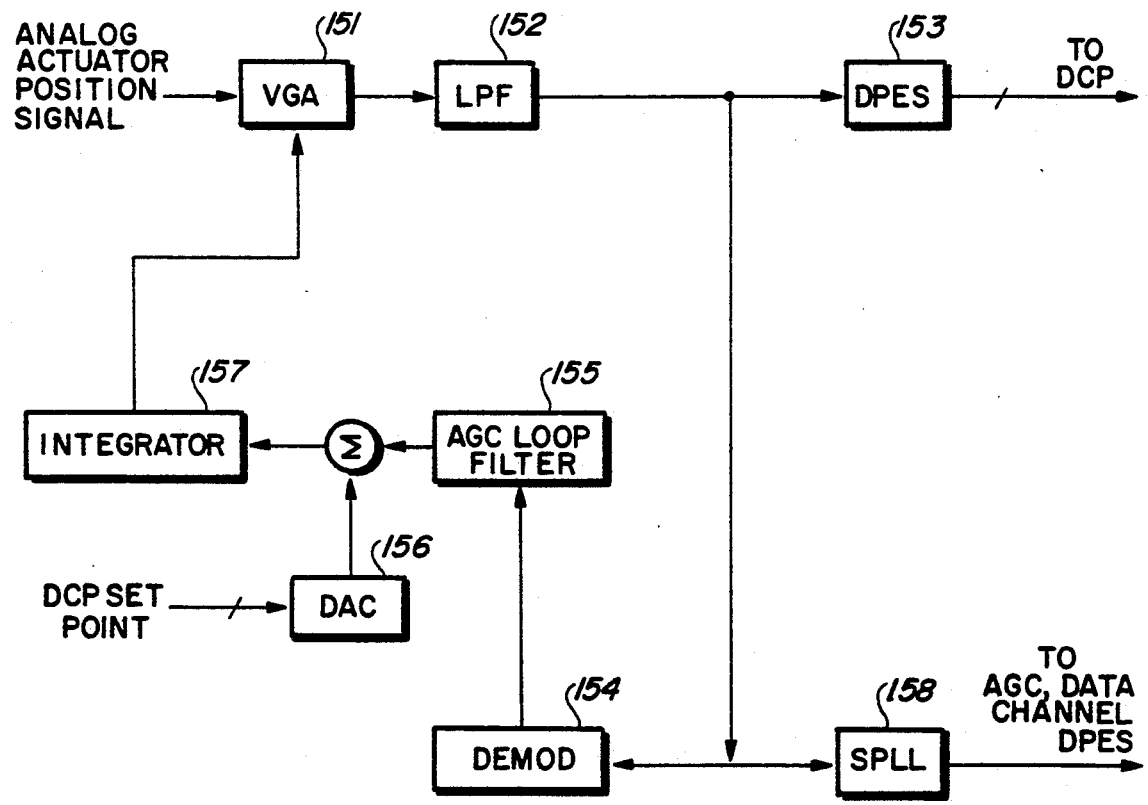
FIG. 8 is a block diagram illustrating a servo channel of a data recording device, which forms an application for a fully differential follower according to the present invention.

Shown in FIG. 8 is a block diagram of a digital integrated position error signal (PES) circuit 150, which forms part of the servo channel control electronics for a data recording device, illustrating another application for the present invention. Digital integrated PES circuit 150 includes voltage gain amplifier 151, low pass filter 152, digital position error signal circuit 153, demodulation circuit 154, automatic gain control filtering circuit 155, digital-to-analog converter 156, integrator 157, and servo phase locked loop 158.

In operation, an analog actuator position signal received from a data access actuator associated with an information storage disk is passed through voltage gain amplifier 151, where it is amplified to a level appropriate for subsequent processing. The amplified signal then passes through low pass filter 152 which, like low pass filters 141 and 143, includes at least one fully differential follower constructed according to the present invention. The filtered output from low pass filter 152 passes through digital position error signal circuit 153 where it is digitized and converted to a quantity indicative of the difference between the actuator's actual and desired position, and subsequently output to an external digital co-processor (DCP).

The filtered output from low pass filter 152 also passes through demodulation circuit 154, where the actuator position signal is extracted from a carrier. The filtered output from low pass filter 152 also passes through servo phase locked loop 158, where it is frequency locked and subsequently output to the clocks for the automatic gain control, data channel, and digital position error signal circuitry (not shown). The output of demodulation circuit 154 passes through automatic gain control loop filter 155, whose filtered output is combined with the DCP set point after conversion of the DCP set point to analog form by digital-to-analog converter 156. The area under the analog signal curve is calculated by integrator 157, and the result fed back to voltage gain amplifier 151 for subsequent use in adjusting the digital position error signal.

Figure 9:
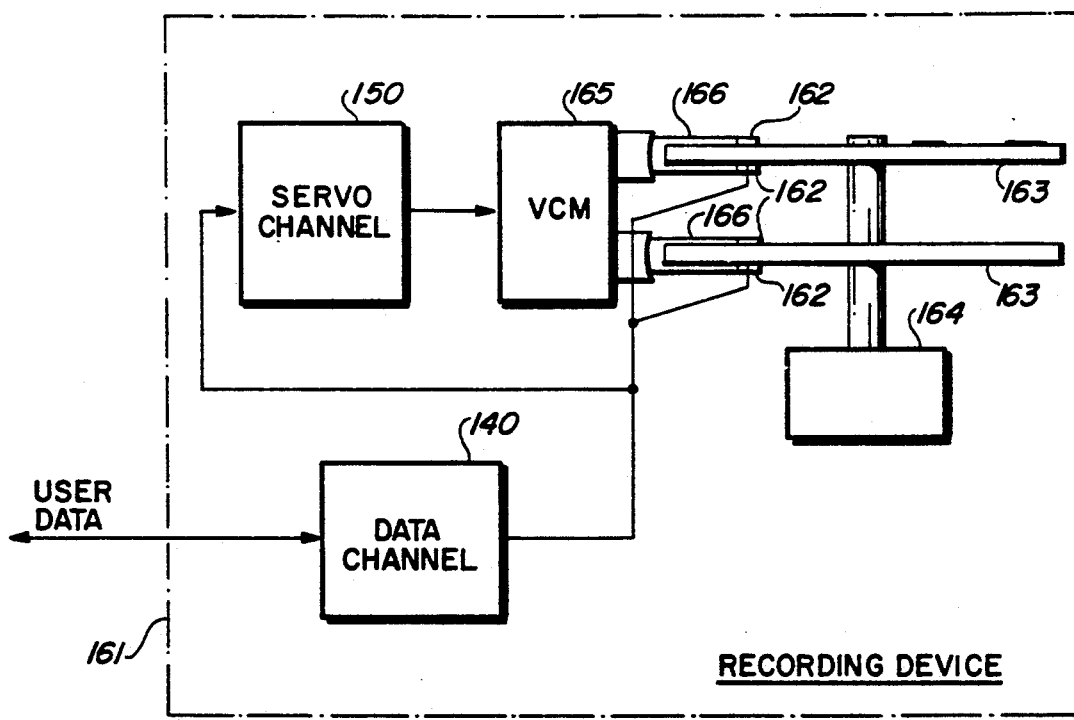
FIG. 9 is a block diagram illustrating a data recording device incorporating a fully differential follower according to the present invention.

Shown in FIG. 9 is a block diagram of a data recording device 160 incorporating the fully differential follower of the present invention. Information recording device 160 includes data channel 140, servo channel 150, housing 161, data heads 162, disks 163, drive means 164, voice coil motor 165, and actuator arms 166. In operation, data channel 140, which includes at least one fully differential follower constructed according to the present invention, sends and receives user data and provides signals to read and write the user data from and to disks 163, through data heads 162. Servo channel 150, which includes at least one fully differential follower constructed according to the present invention, receives servo signals from heads 162 and provides actuator control through voice motor 165, which effects movement of actuator arms 166. Meanwhile, drive means 164 rotates disks 163 past data heads 162 at a constant rate. Housing 161 encloses the entire apparatus to stabilize it and protect it from environmental effects.

It is worthy of note that there exist many possible variations on the above described preferred embodiment and applications. For instance, the technology in which the invention is implemented may be easily changed to suit power, speed, noise, and other requirements as evidenced by the two implementations of the preferred embodiment shown in FIGS. 3 and 4. Functional equivalents of circuit components may be substituted, such as a diode for diode configured MOS device 65. The physical layout of FIG. 9 may be changed in form, such as by removing the data channel and/or the servo channel from the housing. The servo system may implement a dedicated servo approach or a sector servo approach. The number of actuators, heads, and disks may be varied without limit. Further, the present invention is readily applicable to a wide variety of devices, including magnetic and optical disk systems, tape storage systems, audio and video circuits, and any other device having need for a high performance, low noise follower.

While the invention has been particularly described and illustrated with reference to a preferred embodiment, it will be understood by those skilled in the art that changes in the description or illustrations may be made with respect to form or detail without departing from the spirit and scope of the invention.

What is claimed is:

1. A fully differential unity gain operational amplifier comprising:
   a cascode stage having a current summing means;
   a feedback differential transconductance stage having:
   an input for receiving an input signal from said cascode stage;
   a unity gain differential mode feedback means; and
   an output for providing an output current to said current summing means;
   said unity gain differential mode feedback means responsive to said input signal to produce a feedback signal at said output, said feedback signal representative of a differential mode component of said input.

2. A fully differential unity gain operational amplifier comprising:
   a cascode stage having a plurality of inputs, a summing means, and a summed output, each of said plurality of inputs receiving an input current, said summing means responsive to said plurality of inputs to produce a summed output representative of the sum of said input currents; and
   a feedback differential transconductance stage having an input, a unity gain differential mode feedback means, and an output, said input receiving said summed output from said cascode stage, said unity gain differential mode feedback means responsive to said summed output to produce a feedback signal at said output, said feedback signal representative of a differential mode component of said summed output, said output coupled to one of said plurality of inputs to said cascode stage.

3. A fully differential unity gain operational amplifier as recited in claim 1, further comprising:
   an input differential transconductance stage having an input for receiving an input voltage, conversion means for converting said input voltage to a corresponding current, and an output coupled to one of said plurality of inputs to said cascode stage;
   an output buffer having an input for receiving said summed output from said cascode stage and a buffering means responsive to said input to produce an output voltage; and
   an output common mode sensing stage having an input for receiving said output voltage from said output buffer, a sensing means responsive to said input to produce a feedback signal representative of a common mode component of said output voltage, and an output for coupling said feedback signal to one of said plurality of inputs to said cascode stage.

4. A method for producing a differential output having unity gain from a differential input, said method comprising the steps of:
   receiving a plurality of inputs at a summing means;
   summing said plurality of inputs to produce a summed output having a common mode component and a differential mode component;
   receiving said summed output at a unity gain differential mode feedback means;
   sensing said differential mode component of said summed output; and
   feeding back said sensed differential mode component to said summing means.

5. A method for producing a differential output having unity gain as recited in claim 4, further comprising the steps of:
   receiving said summed output at a common mode sensing means;
   sensing said common mode component of said summed output; and
   feeding back said sensed common mode component to said summing step.

6. A fully differential unity gain operational amplifier comprising:
   a cascode circuit having a plurality of paired inputs for carrying a plurality of input signals, a summing means, and a summed output pair, said summing means responsive to said plurality of input signals to produce a summed output representative of the sum of said plurality of input signals;

a differential feedback circuit having a pair of inputs, a unity gain differential mode feedback means, and a pair of outputs, said pair of inputs coupled to said summed output pair of said cascode circuit, said unity gain differential mode feedback means responsive to said summed output to produce a feedback signal at said pair of outputs, said feedback signal representative of a differential mode component of said summed output, said pair of outputs coupled to one of said plurality of paired inputs to said cascode circuit.

7. An electronic filter comprising:

first and second biquads connected to one another in a cascoded relationship, any of said first and second biquads including a fully differential unit gain operational amplifier, said fully differential unity gain operational amplifier including a cascode stage having a current summing means, a feedback differential transconductance stage having an input for receiving an input signal from said cascode stage, a unity gain differential mode feedback means, and an output for providing an output current to said cascode stage, said unit gain differential mode feedback means responsive to said input signal to produce a feedback signal at said output, and said feedback signal representative of a differential mode component of said input.

8. An electronic filter comprising:

a fully differential unity gain operational amplifier having a first input, a second input, a first output, and a second output, said first input coupled through a first capacitor to ground and through a first and a second resistor to a first input voltage level, said second input coupled through a second capacitor to ground and through a third and a fourth resistor to a second input voltage level, said fully differential unity gain operational amplifier further including a cascode stage having a current summing means, a feedback differential transconductance stage having an input for receiving an input signal from said cascode stage, a unity gain differential mode feedback means, and an output for providing an output current to said cascode stage, said unit gain differential mode feedback means responsive to said input signal to produce a feedback signal at said output, said feedback signal representative of a differential mode component of said input.

9. A data channel for use in a data recording device, comprising:

a first filter for receiving and filtering an analog servo signal;

a voltage gain amplifier for receiving and amplifying an analog actuator position signal;

a second filter for receiving and filtering the amplified analog actuator position signal;

summing means, coupled to said first filter and said second filter, for receiving and summing the outputs of said first filter and said second filter;

any of said first filter and said second filter comprising at least one fully differential unity gain operational amplifier, said at least one fully differential unity gain operational amplifier including a feedback differential transconductance stage having an input, a unity gain differential mode feedback means, and an output, said unity gain differential mode feedback means responsive to said input to produce a feedback signal at said output, and said feedback signal representative of a differential mode component of said input.

10. A servo channel for use in a data recording device, comprising:

a voltage gain amplifier for receiving and amplifying an analog actuator position signal;

a filter for receiving and filtering said amplified analog actuator position signal;

error determination means, coupled to said filter, for receiving said analog actuator position signal and determining therefrom a digital position error signal;

said filter comprising at least one fully differential unity gain operational amplifier, said at least one fully differential unity gain operational amplifier including a feedback differential transconductance stage having an input, a unity gain differential mode feedback means, and an output, said unity gain differential mode feedback means responsive to said input to produce a feedback signal at said output, and said feedback signal representative of a differential mode component of said input.

11. A fully differential unity gain operational amplifier comprising:

a first differential input pair having a first differential input means and a second differential input means;

a second differential input pair having a third differential input means and a fourth differential input means;

a differential output pair having a first differential output means and a second differential output means;

said third differential input means having an input coupled to said first differential output means, and an output;

said fourth differential input means having an input coupled to said second differential output means, and an output;

said first differential input means having an input coupled to a first input voltage and an output coupled to the output of said third differential input means and to said first differential output means;

said second differential input means having an input coupled to a second input voltage and an output coupled to the output of said fourth differential input means and to said second differential output means; and common mode feedback means, coupled to the outputs of said first and second differential input means, for providing a common mode output voltage.

12. A data recording device comprising:

a housing:

at least one disk rotatably mounted within said housing;

drive means for rotating said at least one disk;

at least one actuator arm positionable over said at least one disk;

at least one data head attached to said actuator arm, for reading and writing data from and to said at least one disk;

first electronics circuitry coupled to said actuator arm and second electronics circuitry coupled to said at least one data head, any of said first electronics circuitry and said second electronics circuitry comprising at least one fully differential unity gain operational amplifier, said at least one fully differential unit gain operational amplifier including a cascode stage having a plurality of inputs, a summing means, and a summed output, each of said plurality of inputs receiving an input current, said summing means responsive to said plurality of inputs to produce a summed output representative of the sum of said input currents, and a feedback differential transconductance stage having an input, a unity gain differential mode feedback means, and an output, said input receiving said summed output from said cascode stage, said unity gain differential mode feedback means responsive to said summed output to produce a feedback signal at said output, said feedback signal representative of a differential mode component of said summed output, said output coupled to one of said plurality of inputs to said cascode stage.

13. A data storage disk drive apparatus as recited in claim 11, further comprising:

an input differential transconductance stage having an input voltage, conversion means for converting said input voltage into a corresponding current, and an output coupling said current to one of said plurality of inputs to said cascode stage;

an output buffer having an input receiving said summed output from said cascode stage and a buffering means responsive to said input to produce an output voltage; and an output common mode sensing stage having an input receiving said output voltage from said output buffer, a sensing means responsive to said input to produce a feedback signal representative of a common mode component of said output voltage, and an output coupling said feedback signal to one of said plurality of inputs to said cascode stage.

* * * * *